United States Patent
Dudek

(10) Patent No.: US 10,192,745 B2
(45) Date of Patent: Jan. 29, 2019

(54) METHOD FOR MANUFACTURING A LAYER STACK FROM A P+-SUBSTRATE, A P⁻-LAYER, AN N⁻-LAYER AND A THIRD LAYER

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

( * ) Notice: Subject to any disclaimer, the term of this patent is extended or adjusted under 35 U.S.C. 154(b) by 0 days.

(21) Appl. No.: 15/845,530

(22) Filed: Dec. 18, 2017

(65) Prior Publication Data

US 2018/0174841 A1 Jun. 21, 2018

(30) Foreign Application Priority Data

Dec. 17, 2016 (DE) .......................... 10 2016 015 056

(51) Int. Cl.
*H01L 21/00* (2006.01)
*H01L 21/18* (2006.01)
(Continued)

(52) U.S. Cl.
CPC ...... *H01L 21/187* (2013.01); *H01L 21/02546* (2013.01); *H01L 21/02573* (2013.01);
(Continued)

(58) Field of Classification Search
None
See application file for complete search history.

(56) References Cited

U.S. PATENT DOCUMENTS

| 2015/0059832 A1 | 3/2015 | Ghyselen et al. |
| 2015/0083202 A1 | 3/2015 | Ghyselen et al. |

(Continued)

FOREIGN PATENT DOCUMENTS

| CN | 101950774 A | 1/2011 |
| CN | 103219414 A | 7/2013 |

(Continued)

OTHER PUBLICATIONS

Shi et al., "Characterization of GaAs-based n-n and p-n interface junctions prepared by direct wafer bonding," J. of Appl. Phys., vol. 92, No. 12, pp. 7544-7549 (Dec. 15, 2002).

(Continued)

*Primary Examiner* — Bradley Smith
(74) *Attorney, Agent, or Firm* — Muncy, Geissler, Olds & Lowe, P.C.

(57) ABSTRACT

A method for manufacturing a layer stack having a p⁺-substrate, a p⁻-layer, an n⁻-layer and a third layer. A first partial stack and a second partial stack is produced, and an upper side of the first partial stack is integrally bonded with an upper side of the second partial stack, and the first partial stack has at least the p⁺-substrate. The second partial stack has at least the n⁻-layer, and the p⁻-layer is produced by epitaxy or implantation on an upper side of the p⁺-substrate or by epitaxy on the n⁻-layer. The p⁻-layer forms the upper side of the first partial stack or the second partial stack. The third layer is produced prior to or after the wafer bonding, and the n⁻-layer is produced after the wafer bonding by abrading an n⁻-substrate or prior to the wafer bonding on an n⁺-substrate.

8 Claims, 2 Drawing Sheets

(51) Int. Cl.
*H01L 31/0304* (2006.01)
*H01L 31/18* (2006.01)
*H01L 33/00* (2010.01)
*H01L 29/20* (2006.01)
*H01L 21/02* (2006.01)
*H01L 21/265* (2006.01)

(52) U.S. Cl.
CPC ........ *H01L 21/26546* (2013.01); *H01L 29/20* (2013.01); *H01L 31/0304* (2013.01); *H01L 31/184* (2013.01); *H01L 33/0079* (2013.01)

(56) References Cited

U.S. PATENT DOCUMENTS

| | | |
|---|---|---|
| 2016/0204306 A1 | 7/2016 | Ma et al. |
| 2017/0077339 A1* | 3/2017 | Ma ..................... H01L 31/0693 |

FOREIGN PATENT DOCUMENTS

| | | |
|---|---|---|
| CN | 103700712 A | 4/2014 |
| CN | 104701162 A | 6/2015 |
| EP | 2645431 A1 | 10/2013 |

OTHER PUBLICATIONS

German Ashkinazi, "GaAs Power Devices", 1999, ISBN-965-7094-19-4, pp. 8-9, 22-26.

* cited by examiner

METHOD FOR MANUFACTURING A LAYER STACK FROM A P+-SUBSTRATE, A P−-LAYER, AN N−-LAYER AND A THIRD LAYER

This nonprovisional application claims priority under 35 U.S.C. § 119(a) to German Patent Application No. 10 2016 015 056.4, which was filed in Germany on Dec. 17, 2016, and which is herein incorporated by reference.

BACKGROUND OF THE INVENTION

Field of the Invention

The invention relates to a method for manufacturing a layer stack from a $p^+$-substrate, a $p^-$-layer, an $n^-$-layer and a third layer.

Description of the Background Art

A high-voltage resistant semiconductor diode $p^+$-n-$n^+$ (pages 8 and 9) is known from "GaAs Power Devices" by German Ashkinazi, ISBN 965-7094-19-4, wherein the $n^-$ and the $n^+$-layer are manufactured by means of liquid phase epitaxy between two $p^+$-substrates. In Chapter 3, pages 22 to 26, a Schottky diode is described having an epitaxial layer construction comprising a GaAs with an $n^+$-substrate and a nickel-containing layer for forming the Schottky contact.

EP 2 645 431 A1, which corresponds to US 2015/0059832, describes a method for manufacturing a tandem solar cell comprising two or more solar cells, wherein at least one first solar cell is produced on a base-substrate structure, a second solar cell is produced on an auxiliary substrate, and the two solar cells are subsequently integrally bonded by means of wafer bonding.

SUMMARY OF THE INVENTION

It is therefore an object of the present invention to provide a method which further develops the state of the art.

According to an exemplary embodiment, a method for manufacturing a layer stack comprising a $p^+$-substrate, a $p^-$-layer, an $n^-$-layer and a third layer is provided.

The $p^+$-substrate has a dopant concentration of $1*10^{18}$-$5*10^{20}$ cm$^{-3}$ and a layer thickness of 50-500 microns, and comprises a GaAs compound or consists of a GaAs compound.

The $p^-$-layer has a dopant concentration of $10^{14}$-$10^{16}$ cm$^{-3}$ and a layer thickness of 0.01-30 microns, and comprises a GaAs compound or consists of a GaAs compound.

The $n^-$-layer has a dopant concentration of $10^{14}$-$10^{16}$ cm$^{-3}$, a layer thickness of 10-200 microns, and comprises a GaAs compound or consists of a GaAs compound.

A first partial stack and a second partial stack are produced and an upper side of the first partial stack is integrally bonded to an upper side of the second partial stack by means of wafer bonding in order to manufacture the layer stack.

The first partial stack comprises at least the $p^+$-substrate, while the second partial stack comprises at least the $n^-$-layer.

The $p^-$-layer is manufactured by means of epitaxy, e.g., LPE or MOVPE, or by implantation on an upper side of the $p^+$-substrate or by means of epitaxy on the $n^-$-layer, and forms the upper side of the first partial stack or of the second partial stack. The third layer is produced before or after the wafer bonding.

The $p^-$-layer can have a doping less than $10^{13}$ N/cm$^3$ or a doping between $10^{13}$ N/cm$^3$ and $10^{15}$ N/cm$^3$. In an embodiment, the $p^+$-substrate is thinned by a grinding process prior to or after the bonding to a thickness in the range of 200 microns and 500 microns.

In an embodiment, the $n^-$-layer is produced after the wafer bonding by abrading the $n^-$-substrate, which at least partially forms the second stack, by connecting the $n^-$-substrate with the first stack by means of a wafer bonding process, starting from an $n^-$-substrate. In a subsequent step, the $n^-$-substrate and thus the $n^-$-layer is thinned to the desired thickness.

In an embodiment, the $n^-$-layer is produced epitaxially on an $n^+$-substrate before the wafer bonding.

The thickness of the $n^-$-layer can be in a range of 50 microns to 250 microns.

The doping of the $n^-$-layer can be in a range between $10^{13}$ N/cm$^3$ and $10^{15}$ N/cm$^3$.

An advantage of manufacturing the $n^-$-layer by means of additional wafer bonding is that thick $n^-$-layers can be readily manufactured. Thus, there is no need for a long deposition process during epitaxy. By means of the additional wafer bonding process, the number of stacking faults can also be reduced.

In an embodiment, the $n^-$-layer can have a doping greater than $10^{10}$N/cm$^{-3}$ and less than $10^{13}$ N/cm$^{-3}$. Because the doping is extremely low, the $n^-$-layer can also be regarded as an intrinsic layer.

In an embodiment, after thinning of the $n^-$-substrate, the $n^+$-layer can be manufactured on the $n^-$-substrate by means of epitaxy or high-dose implantation in a range between $10^{18}$ N/cm$^3$ and less than $5\times10^{19}$ N/cm$^3$. The thinning of the $n^-$-substrate preferably takes place by means of a CMP step, i.e., by means of chemical mechanical polishing.

It is noted that the term wafer bond can be used interchangeably with the term semiconductor bond. For example, the first partial stack can be formed monolithically and the second partial stack can also be formed monolithically.

The substrate and the first layer and the second layer are III-V semiconductor layers, and wherein, in a further development, the layers and the substrate can each have the same lattice constant and can comprise the same semiconductor material, in particular GaAs.

An advantage is that due to the wafer bonding and due to the $p^-$-interlayer, the quality of the crystal structure of the manufactured layer stack can be achieved with a high layer quality, in particular for the thick semiconductor layers, as compared to, e.g., stacks manufactured only by means of epitaxy and/or without interlayers. In particular, layer stacks can be manufactured with few offsets. This substantially increases the charge carrier lifetime, in particular for the $n^-$-layers. It is also possible to introduce recombination centers in the p-interlayer prior to the wafer bonding in order to influence the lifetime of the charges in the p-interlayer.

An advantage of separating the $n^-$-layer is that the carrier or the $n^-$-substrate of the second partial stack can be reused several times.

The same is true for the $n^+$-substrate, i.e., by separating a thin $n^+$-layer, the $n^+$-substrate can be reused. Preferably, the $n^-$-layer can also be produced epitaxially prior to separating a thin $n^+$-layer. In other words, in a further embodiment, the $n^+$-layer, as a region of the $n^+$-substrate directly adjacent to the $n^-$-layer, is separated from the $n^+$-substrate together with the $n^-$-layer prior to the wafer bonding.

In an embodiment, the $n^-$-layer produced prior to the wafer bonding can be produced prior to being separated by means of epitaxy, e.g., LPE or MOVPE, on an $n^+$-substrate or by implantation within an $n^+$-substrate.

According to an embodiment, the third layer is formed as an $n^+$-layer with a dopant concentration of at least $5*10^{18} cm^{-3}$, a layer thickness of less than 20 microns and comprising a GaAs compound or consisting of a GaAs compound.

The $n^+$-layer can be formed after the wafer bonding by means of epitaxy on the $n^-$-layer produced by abrasion or by implantation in the $n^-$-layer produced by abrasion.

In an embodiment, the $n^-$-layer can be separated from an $n^+$-substrate by means of implanting impurities.

The separation of the $n^-$-layer and/or the $n^+$-layer from the $n^+$-substrate takes place by implanting impurities.

According to an embodiment, the third layer comprises a metal or a metallic compound or consists of a metal or a metallic compound.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
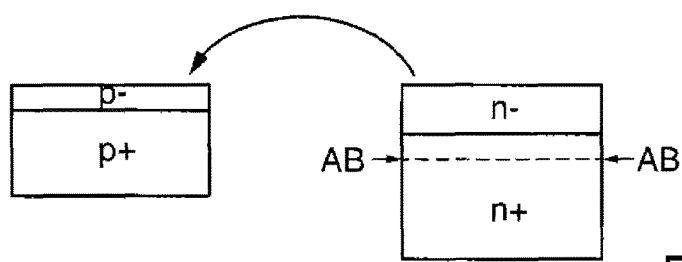
FIG. 1 is a schematic view of an embodiment of a method for manufacturing according to the invention.

The illustration in FIG. 1 shows a view of an embodiment of the manufacturing method according to the invention.

On a p+-substrate with a dopant concentration of $5*10^{18}$-$5*10^{20}$ $cm^{-3}$ and a layer thickness of 50-500 microns, a p--layer having a dopant concentration of $10^{14}$-$10^{16}$ $cm^{-3}$ and a layer thickness of 0.01-30 μm is produced, wherein both the $p^+$-substrate and the p--layer comprise a GaAs compound or consist of a GaAs compound.

The layer sequence of p+-substrate and p--layer form a first partial stack, wherein the p--layer forms an upper side of the partial stack.

On an n+-substrate with a dopant concentration of at least $5*10^{18}$ $cm^{-3}$, an n--layer having a dopant concentration of $10^{12}$-$10^{16}$ $cm^{-3}$ and a layer thickness of 10-300 microns is manufactured by means of epitaxial growth, for example by liquid phase epitaxy or MOVPE, wherein the n+-substrate and the n--layer comprise a GaAs compound or consist of a GaAs compound.

Subsequently, the n--layer is separated from the n+-substrate at the position AB, together with a first region of the n+-substrate which is directly adjacent to the n--layer. The separation is effected, for example, by implanting imperfections in the n+-substrate.

The separated region of the n+-substrate forms a third layer of the layer stack and has a layer thickness of less than 30 μm. The layer sequence of n--layer and n+-layer forms a second partial stack, wherein the n--layer forms an upper side of the partial stack.

The upper side of the first partial stack is integrally bonded with the upper side of the second partial stack by means of wafer bonding, i.e., the layer sequence of $n^-$-layer and $n^+$-layer present after separation is applied to the upper side of the p--layer with an upper side of the $n^-$-layer, and the two upper sides are integrally bonded by means of wafer bonding.

Figure 2:
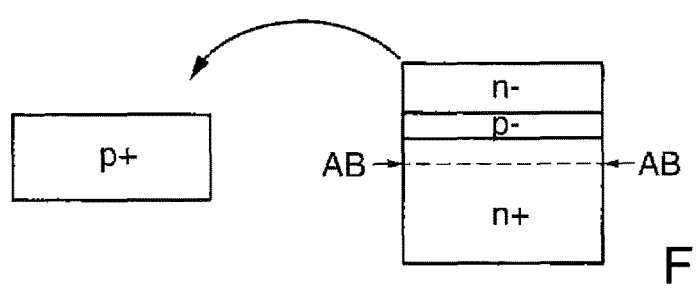
FIG. 2 is a schematic view of an embodiment of a method for manufacturing according to the invention, FIGS. 3A,B are a schematic view of an embodiment of a method for manufacturing according to the invention.

The illustration of FIG. 2 shows an embodiment of the manufacturing method according to the invention. In the following, only the differences to the illustration in FIG. 1 are described.

According to this embodiment, the p--layer is produced by means of epitaxy on an upper side of the $n^-$-layer and forms the upper side of the second partial stack while the first partial stack comprises only the p+-substrate.

Figure 3A:
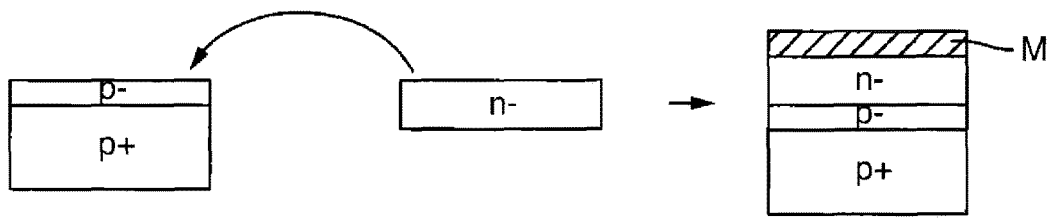
Figure 3B:
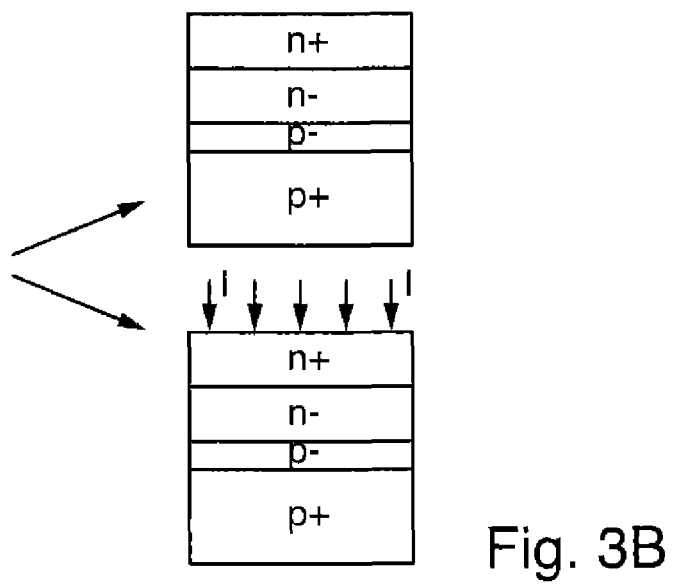

The illustrations of FIGS. 3A and 3B show an embodiment of the manufacturing method according to the invention. In the following, only the differences to the illustration in FIG. 1 are described.

According to this embodiment, the first partial stack is formed as in the first embodiment from the p+-substrate and the p--layer. The second partial stack is formed from an n--substrate. The $n^-$-layer is produced after the integral bonding of the first partial stack with the second partial stack by abrading the n--substrate to a desired layer thickness.

After the abrasion, the third layer is applied to the upper side of the n--layer and is integrally bonded with the upper side, for example by means of epitaxy. Alternatively, the third layer is formed in the $n^-$-layer by means of an implantation I of dopants into the surface of the $n^-$-layer. The third layer is an $n^+$-layer. Alternatively, the third layer consists of a metal or a metallic compound or comprises a metal or a metallic compound.

Figure 4:
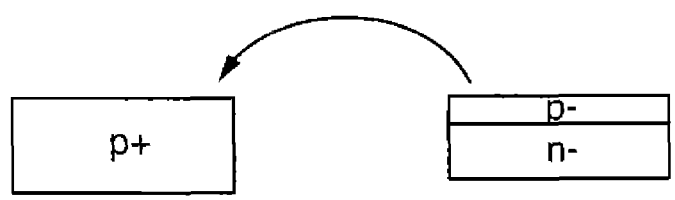
FIG. 4 is a schematic view of an embodiment of a method for manufacturing according to the invention.

The illustration in FIG. 4 shows an embodiment of the manufacturing method according to the invention. In the following, only the differences to the illustrations in the previous figures are described.

This embodiment corresponds to the third embodiment with the difference that the p--layer is produced on the n--substrate by means of epitaxy.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing a layer stack from a $p^+$-substrate, a $p^-$-layer, an $n^-$-layer and a third layer, the method comprising:
   providing the $p^+$-substrate with a dopant concentration of $5*10^{18}$-$5*10^{20} cm^{-3}$ and a layer thickness of 50-900 microns, and comprising a GaAs compound;
   providing the $p^-$-layer with a dopant concentration of $10^{14}$-$10^{16}$ $cm^{-3}$ and a layer thickness of 0.01-1 micron, and comprising a GaAs compound;
   providing the $n^-$-layer with a dopant concentration of $10^{14}$-$10^{16}$ $cm^{-3}$, a layer thickness of 10-200 microns, and comprising a GaAs compound;
   producing a first partial stack and a second partial stack, an upper side of the first partial stack is integrally bonded with an upper side of the second partial stack via wafer bonding to manufacture the layer stack, the first partial stack comprising at least the $p^+$-substrate, the second partial stack comprising at least the $n^-$-layer;

producing the $p^-$-layer via epitaxy or implantation on an upper side of the $p^+$-substrate or via epitaxy on the $n^-$-layer, the $p^-$-layer forming the upper side of the first partial stack or of the second partial stack;

producing the third layer prior to or after the wafer bonding;

producing the $n^-$-layer after the wafer bonding by abrading an $n^-$-substrate and at least partially forming the second partial stack or producing the $n^-$-layer before the wafer bonding on an $n^+$-substrate.

2. The method for manufacturing according to claim 1, wherein the $n^-$-layer produced prior to the wafer bonding on the $n^+$-substrate is manufactured via epitaxy on an $n^+$-substrate.

3. The method for manufacturing according to claim 1, wherein the third layer is formed as an $n^+$-layer having a dopant concentration of at least $10^{19} cm^{-3}$, a layer thickness less than 30 microns and comprises a GaAs compound.

4. The method for manufacturing according to claim 3, wherein the $n^+$-layer is produced after the wafer bonding via epitaxy on the $n^-$-layer produced via abrasion, or by implantation in the $n^-$-layer produced via abrasion, or via separation from the $n^+$-substrate.

5. The method for manufacturing according to claim 1, wherein the $n^+$-layer, as a region of the $n^+$-substrate directly adjacent to the $n^-$-layer, is separated from the $n^+$-substrate together with the $n^-$-layer prior to the wafer bonding.

6. The method for manufacturing according to claim 1, wherein the $n^-$-layer is separated from an $n^-$-substrate by implanting impurities.

7. The method for manufacturing according to claim 1, wherein the $n^-$-layer is separated from the $n^+$-substrate by implanting impurities or wherein the $n^+$-layer is separated from the $n^+$-substrate by implanting impurities.

8. The method for manufacturing according to claim 1, wherein the third layer comprises a metal or a metallic compound or consists of a metal or a metallic compound.

* * * * *